United States Patent [19]

Angiulli et al.

[11] Patent Number: 5,362,986
[45] Date of Patent: Nov. 8, 1994

[54] VERTICAL CHIP MOUNT MEMORY PACKAGE WITH PACKAGING SUBSTRATE AND MEMORY CHIP PAIRS

[75] Inventors: John M. Angiulli, Lagrangeville; Eugene S. Kolankowsky, Wappingers Falls; Richard R. Konian, Poughkeepsie; Leon L. Wu, Hopewell Junction, all of N.Y.

[73] Assignee: International Business Machines Corporation, Armonk, N.Y.

[21] Appl. No.: 109,230

[22] Filed: Aug. 19, 1993

[51] Int. Cl.⁵ .................. H01L 23/498; H01L 23/538
[52] U.S. Cl. .................. 257/723; 257/690; 257/691; 257/777
[58] Field of Search ............ 257/700, 723, 691, 698, 257/684, 778, 779, 690, 777; 361/743, 760, 783

[56] References Cited

U.S. PATENT DOCUMENTS

| | | | |
|---|---|---|---|
| 4,801,992 | 1/1989 | Golubic | 257/777 |
| 4,855,809 | 8/1989 | Malhi et al. | 357/75 |
| 4,922,378 | 5/1990 | Malhi et al. | 361/387 |
| 5,031,072 | 7/1991 | Malhi et al. | 361/387 |
| 5,057,909 | 10/1991 | Mok et al. | 357/81 |

FOREIGN PATENT DOCUMENTS

| | | |
|---|---|---|
| 0016535 | 1/1987 | Japan . |
| 0099559 | 4/1988 | Japan ............... 257/723 |
| 0104361 | 5/1988 | Japan . |
| 0129449 | 5/1989 | Japan ............... 257/700 |

OTHER PUBLICATIONS

Kolankowsky et al., Silicon Memory Cube, IBMTDB, vol. 18, No. 10, Mar. 1976, pp. 3239-3242.
"Vertical Chip Packaging", R. A. Henle, IBM Technical Disclosure Bulletin, vol. 20, No. 11A, pp. 4339-4340, Apr. 1978.

*Primary Examiner*—Rolf Hille
*Assistant Examiner*—Peter Toby Brown
*Attorney, Agent, or Firm*—Lynn L. Augspurger

[57] ABSTRACT

A packaging substrate (10) is populated with memory chip cube(s) (40) and horizontally mounted interconnect chip(s) (19) mounted on the substrate which are joined during assembly using two kinds of lead tin solder alloys to form the memory chip cube. One is a high melting point lead tin alloy (HMA), another is a lower melting point lead tin alloy (LMA). The memory chip pairs (11) of the memory cube are formed by placing functional memory chips over other functional memory chips before they were diced. The chip pads of the individual memory chips and the lead tin pads of the memory chips within the wafer are aligned and the high melting point lead tin solder is reflowed, forming memory chip pairs.

9 Claims, 8 Drawing Sheets

VERTICAL CHIP MOUNT MEMORY PACKAGE WITH PACKAGING SUBSTRATE AND MEMORY CHIP PAIRS

FIELD OF THE INVENTION

This invention is related to electrical packaging methods and apparatus, and more particularly related to methods and apparatus mounting integrated circuit chips vertically to form a system module.

BACKGROUND OF THE INVENTION

As background for our invention there have been patents related to vertically mounted integrated circuit components, as illustrated by Malhi et al, U.S. Pat. Nos. 4,855,809 (August 1989) and 4,922,378 (May 1990). Generally today integrated circuits are placed in dual in line packages (DIPs) or surface mounted on a printed circuit board. The downscaling of devices in memory circuit technology has permitted an improvement in the density of memory circuits. While significant progress was made in improving the semiconductor technology, the packaging technology has lagged. In 1976, Kolankowsky et al in "Silicon Memory Cube," IBM Technical Disclosure Bulletin vol. 18, No. 10, (March 1976) pp. 3239-42 described that if the memory chips and the supporting chip can be stacked into a cube, the memory performance can be improved. In 1978, Henle in "Vertical Chip Packaging," IBM Technical Disclosure Bulletin vol. 20, No. 11A, (April 1978) pp. 4339-40. Described two methods to place a chip vertically on the top surface of the packaging substrate. One method is to use a right angle metallic foil to support the chip. Another method is to create a slot on the substrate and then stand the memory chip in the slot. In 1989 and later in 1990, Malhi et al in U.S. Pat. Nos. 4,855,809 (August 1989) and 4,922,378 (May 1990) used a technique similar to Henle's slot method to place chips vertically on a packaging substrate. He chose the substrate to be another silicon block or wafer. He further proposed to create the slot in the silicon block by using chemical etching. The obvious drawback of the slot method is the complexity and the inconsistency in creating a well defined deep slot on the silicon surface and placing the chip into the slot. The complexity and the inconsistency of the problem addressed by the present invention is illustrated by these prior devices, and results from many aspects of the manufacture process tolerances. In considering packaging of vertically mounted devices, the thickness of the silicon memory chip needs to be considered, as well as the process of placement of the chip in the manufacturing process. The problem addressed by the invention is to provide the high density memory chips for a computer for use in an air cooled environment as well as a fluid cooled environment. An improvement in this ad needs to address the packaging, so as not only provides high packaging density but also eliminates drawbacks of the manufacturing processes, the complexity and inconsistency of the previous schemes. This invention is related to electrical packaging methods and apparatus, and more particularly related to methods and apparatus mounting integrated circuit chips vertically to form a system module.

SUMMARY OF THE INVENTION

The present invention disclosed and claimed herein describes a memory system module package which substantially reduces problems and disadvantages associated with prior memory chip package. The invention allows the mounting of a plurality of memory chip pairs vertically to form a chip cube and a plurality of interconnect chips horizontally on a packaging substrate. A packaging density is orders of magnitude better than conventional card on board technology. The wiring length between the semiconductor chips and the interconnect chips were reduced by an order of magnitude, providing significant improvement on signal propagation delay and skew.

In accordance with our invention an integrated circuit chip package has a packaging wiring substrate, which can either be a silicon wafer, or a ceramic substrate or a printed circuit board, forming a planar base member onto which connecting chips are placed horizontally in a conventional manner and integrated circuit memory chip pairs are placed vertically and in close spacing between one another forming a memory chip cube mounted on the packaging wiring substrate. The connecting chips as well as the memory chip pairs inside the memory cube are connected electrically and mechanically to the packaging substrate with lead tin solder balls. Furthermore, these lead tin solder balls serve to space the individual chips which form chip pairs of the memory cube during assembly and also assist after assembly in forming interconnection pathways between chips. Tile connecting chips and the memory chips are wired together and are wired to next level package through the wiring inside the packaging substrate and package I/O.

As the memory chips are joined together and joined to the packaging substrate, each lead tin ball on the packaging substrate is connected to one signal or power I/O of either chip in the chip pair.

In accordance with our invention, the base member packaging substrate becomes a base support member for a protective cap and for a cooling plate which are attached to the substrate.

Our method of assembling the memory chip cube and joining the cube to the packaging substrate includes three steps. First, the memory chip pair are fabricated. Second, the memory chip pairs are assembled into a memory chip cube. Third, the memory chip cube is placed on the packaging substrate and joined to the substrate. Manufacturing is simplified by the process employed.

These and other improvements are set forth in the following detailed description. For a better understanding of the invention with advantages and features, refer to the description and to the drawings.

BRIEF DESCRIPTION OF THE DRAWINGS.

The features and advantages are illustrated for our preferred and alternative embodiments of the invention in the accompanying drawings in which like reference characters refer to the same parts throughout the views.

Figure 1:
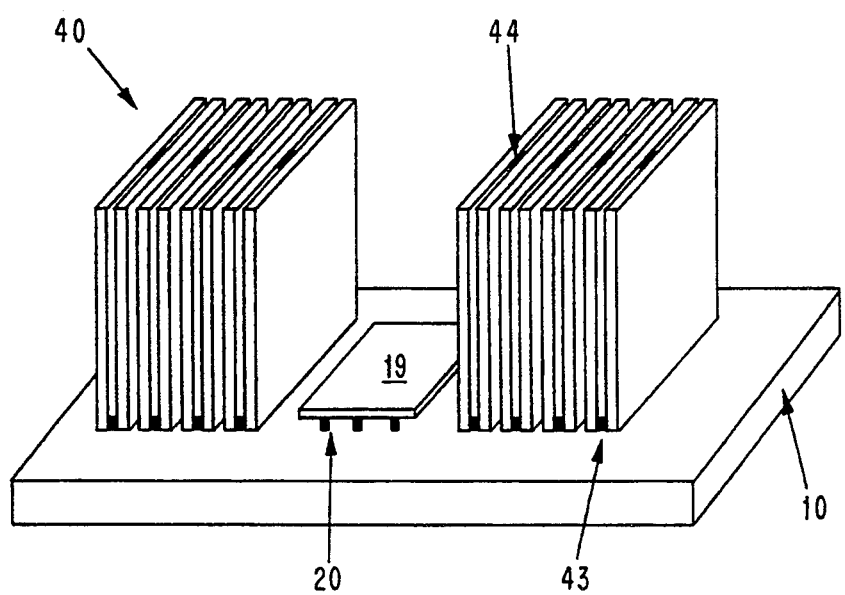
FIG. 1 shows an isometric view of the vertical chip mount package, constructed in accordance with the invention, and to which multiple memory chips are vertically mounted and multiple interconnect chips (logic support chips) are horizontally mounted.

(Note: For convenience of illustration, FIGURES may be separated in parts and as a convention we place the top of the FIGURE as the first sheet, with subsequent sheets proceeding down and across when viewing the FIGURE, in the event that multiple sheets are used.)

Our detailed description explains the preferred embodiments of our invention, together with advantages and features, by way of example with reference to the following drawings.

DETAILED DESCRIPTION OF THE INVENTION

Before considering our preferred embodiments in detail, it may be worthwhile to provide an overview of the elements which will be found described in accordance with our invention in the various FIGURES.

A packaging substrate (10) will be populated with dense integrated chip devices which comprise memory chip cubes (40) and interconnection chips (19). The interconnect chips (19) and the memory chip cubes (40) are joined to the packaging substrate (10) with lead tin alloy solder. There are two kinds of lead tin alloys used in forming the memory chip cube. One is referred to as high melting point lead tin alloy (HMA), another is referred to as low melting point lead tin alloy (LMA). The HMA has a melting point which is higher than that of the LMA. To form the memory chip cube (40), first the memory chip pairs are joined together with HMA solder. Then, in a boat, a silicon assembly bar is used to join together many memory chip pairs (11) with LMA solder to form the memory chip cube (42). Then the memory chip cube (42) is placed on the packaging substrate (10). The solder pads (20) of the interconnect chip (19) and the solder pads (43) of the memory chip pairs (11) are aligned on the packaging substrate with the solder pads (21) and solder pads (18) of the packaging substrate (10) respectively. The joints between the packaging substrate (10) and the memory chip pairs (11) and between the packaging substrate (10) and the interconnect chip (19) are is formed by heating the packaging substrate (10) above the melting point of HMA solder and cooling down to room temperature. Then, the packaging substrate (10) is heated again to a temperature higher than the melting point of LMA solder but lower than that of HMA solder. The bar (41) over the silicon memory chip cube (42) is removed. A final form of the memory chip cube (40) is then formed. And the fabrication of the vertical mount package is completed by capping the chips and attaching a polyimide I/O flex tape, and if necessary installing an appropriate heat sink.

The Preferred Embodiment

Figure 2:
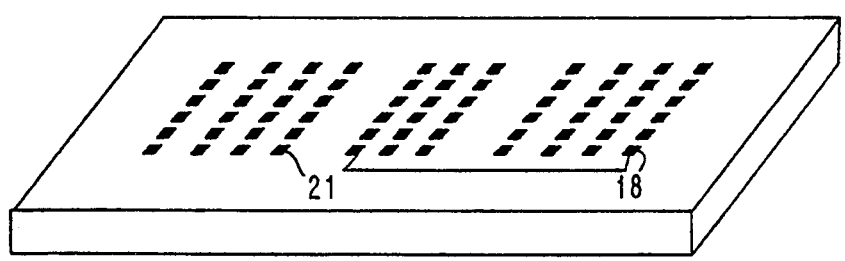
FIG. 2 shows an enlarged and partial sectional view of the packaging substrate with chips removed.

Turning now to our invention in greater detail, it will be seen from referring to the FIG. 1 isometric view of the vertical chip mount package, constructed in accordance with the invention, and to which multiple memory chips in the form or a memory cube (40) are vertically mounted and multiple interconnect or connection chips (19) (logic support chips) are horizontally mounted on a planar base member substrate (10) having electrical and mechanical bonding pads for connecting the chip pairs of the memory cube (40) to the substrate and to other elements mounted on the pads of the substrate illustrated by FIG. 2 which shows an enlarged and partial sectional view of the packaging substrate with chips removed; but, which illustrates the placing of bonding pads (21) and (18) which provide connections to the chips mounted on the pads and provide an interconnection path between chips as illustrated by the line between pads (21) and (18).

Figure 8:
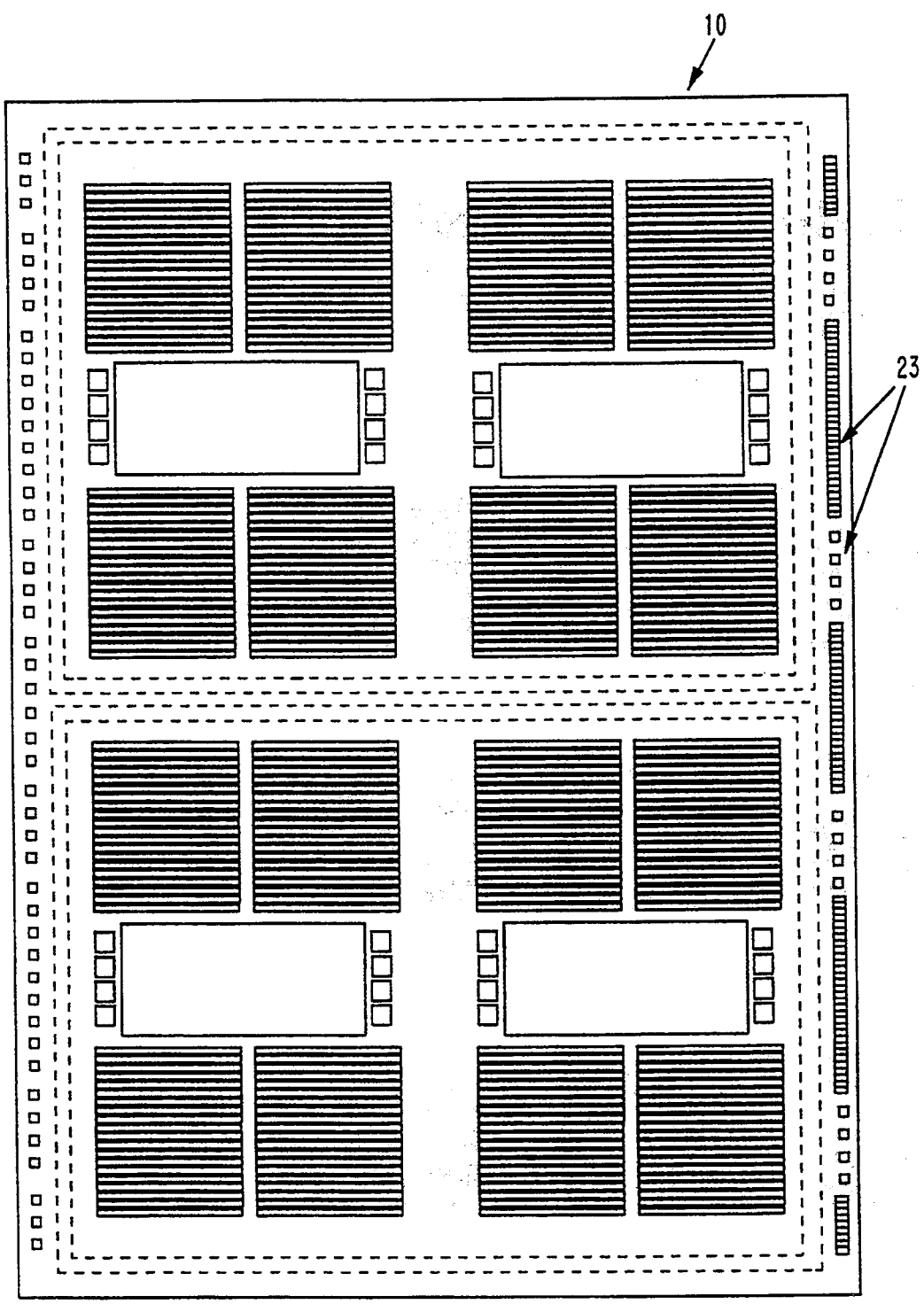
FIG. 8, illustrates the top view of vertical chip mount memory package. In our preferred embodiment it comprises four sets of eighty memory chips and their respective interconnect chips.

FIG. 1 shows a section of the assembled vertical chip mount memory package that a base member packaging substrate (10) in accordance with our invention is provided with a number of memory chip pairs making up a cube (40) mounted vertically thereon together as to form the cube (40) with an interconnect chip (19) mounted horizontally thereon. The number of memory chip pairs (11) supported by the interconnect chip (19) in the preferred embodiment is forty, as shown in FIG. 8. In the preferred embodiment sixteen memory chip cubes are mounted on the packaging substrate (10) comprising one hundred and sixty chip pairs (11) and four interconnect chips (19).

The memory chip pairs are joined with two rows of lead tin balls, an upper edge row (44) and a lower edge row (43) on opposite edges of the chip pairs (11) of the memory cube (40). The bottom edge (43) lead tin balls are located on the bottom edge of chip pair and the chip pair is placed vertically on the surface of the wiring substrate. This row of lead tin balls (43) serves two purposes, to connect each chip pair mechanically to the packaging substrate and to connect signal and power I/O of the memory chips to the wiring and the power distribution bus of the packaging substrate. On the top edge of the chip pairs, there is another row of lead tin balls (44). The number of lead tin balls in this row is not high. And they are concentrated at the center of the top edge. The purpose of this lead tin ball is to maintain the spacing of the chip pair and to connect to a temporary silicon assembly bar when the memory chip pairs are assembled into a memory chip cube.

The arrangement for lead tin pads (21) and (18) shown in FIG. 2 for the lead tin balls (43) on the bottom edge of a chip pair as described preferably in our invention follows three rules. Their number is even. They maintain mirror symmetry so that as they turn face to face, each lead tin ball will join to another lead tin ball. Each lead tin ball on one chip falls into two categories.

One category has "active" lead tin pads, because they are connected to the signal or power I/O of the chip. The other category of lead tin pads are "dummy" pads because they are floating.

Figure 3A:
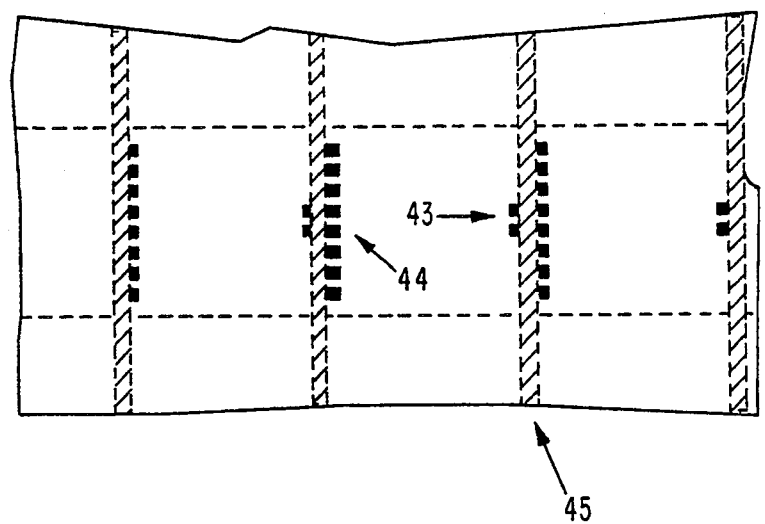
FIGS. 3A and 3B respectively show enlarged partial sectional and enlarged partial top and cross section views of memory wafer, memory chips, and memory chip pairs like those of FIG. 1.
Figure 3B:
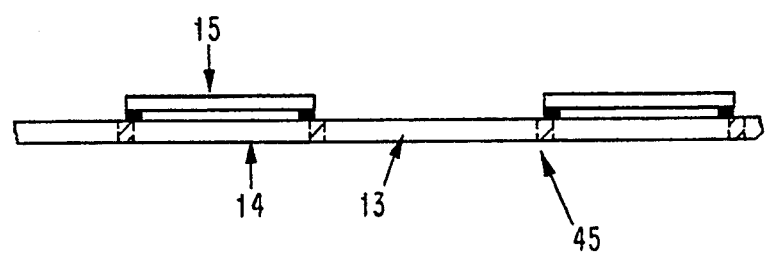

The process of making the memory chip pairs (11 in FIG. 5 et seq.) of the cube (40) shown in FIG. 1 is illustrated in FIGS. 3A and 3B which respectively show a top view and cross sectional view of the substrate (10) of FIG. 1. FIGS. 3A and 3B in the enlarged partial sectional and enlarged partial top and section views of memory wafer, memory chips, and memory chip pairs like those of FIG. 1 show how the pairs are made. A memory wafer (13) comprising a multitude of memory chips (14) is tested and the functional memory chips (14) are identified. On each functional memory chip (14), a tested good memory chip (15) is placed. The memory chip pads corresponding to the memory chip lead tin pads on the wafer are aligned and the wafer (13) and the memory chips (15) on the wafer are heated to high enough temperature to liquify the solder on the solder pads shown as black points in the drawing of FIG. 3B in the cross section view. In this manner the memory chips (15) are joined to the memory chip (14) on the wafer (13) mechanically and electrically.

In order to achieve this connection on one edge of the chip pairs (11) which comprise a first chip (14) and second chip (15), one row of lead tin balls (43) is evenly distributed. Each of the lead tin balls in this row is preferably connected to one active signal terminal of either chip (14) or (15) in the chip pair (11). In order to achieve this condition with one pad number for both chip (14) and chip (15), in accordance with our invention, several design rules for this row of lead tin balls must be followed. First, the number of lead tin pads on one chip must be an even number. Second, mirror symmetry with respect to the chip must be maintained. Thus, if one chip is turned to face another chip, each lead tin pad on the one chip will be matched and joined to one pad on the other chip. Third, the active lead tin pad and dummy lead tin pad must be alternated. The active lead tin pad is a pad which will connect to the active signal terminal inside the memory chip. The dummy lead tin pad is a floating lead tin pad. As two of such chips are joined together face to face, the active lead tin pad on one chip is joined to the dummy lead tin pad on the other chip. Therefore, each lead tin solder pad on the substrate will connect to one active signal terminal of either chip. On the opposite edges of the chip pairs, a solder ball pad or pads (44) are located close to a center of the edge. These lead tin ball or balls (44) are not connected electrically to either chip (14) or chip (15). The purpose of the lead tin ball is two fold. First, it is used to maintain the even gap spacing between chip (14) and chip (15) after they are joined. Second, this lead tin ball is used to connect the LMA solder of the silicon support bar in the process to assemble the memory chip cube. The memory chip pairs are separated by diamond saw dicing as illustrated by FIG. 3. The dicing saw track (45) will cut across the solder balls and leave the solder surfaces flush with the edge of the chip.

The process of assembly of a package is illustrated by FIG. 4 through FIG. 7 in order to achieve the package having a plurality of memory cubes (40) on the substrate as illustrated in FIG. 8.

Figure 4:
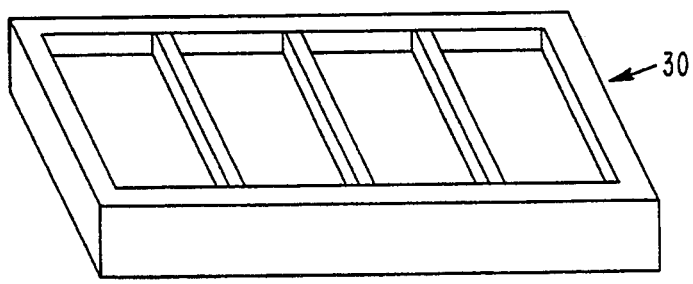
FIG. 4 shows a view of the memory chip cube assembling boat.
Figure 5:
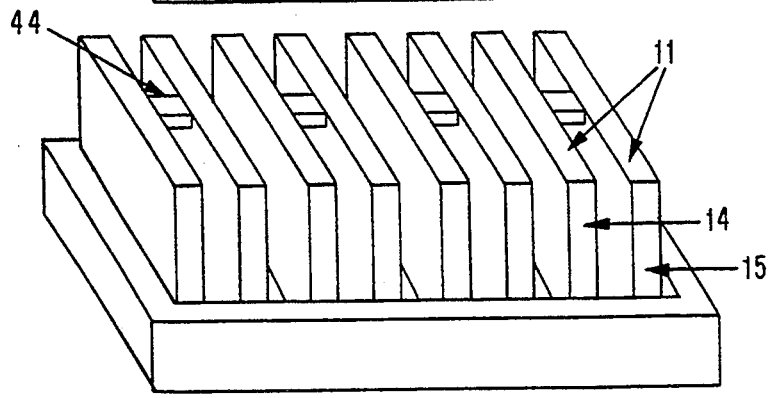
FIG. 5 shows a view of the boat for assembling the memory chip cube and the memory chip pairs which were placed inside the assembling boat.
Figure 6:
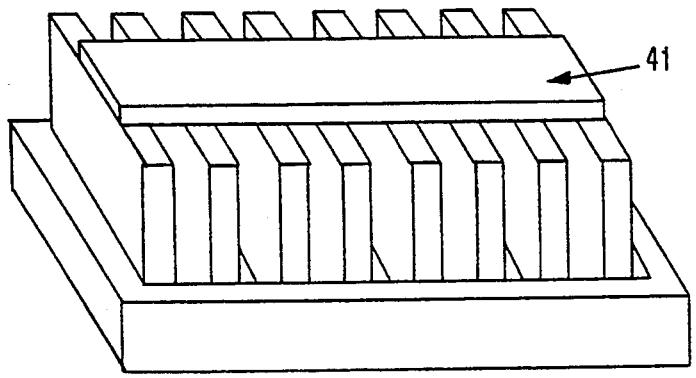
FIG. 6 shows a view of the assembling boat, memory chip pairs and memory chip cube silicon supporting bar.

There are two kinds of lead tin alloys used in forming the memory chip cube. One is referred to as high melting point lead tin alloy (HMA), another is referred to as low melting point lead tin alloy (LMA). The HMA has a melting point which is higher than that of the LMA. The memory chip pairs (11) are formed by placing functional memory chips over other functional memory chips before they are diced. The chip pads of the individual memory chips and the lead tin pads of the memory chips within the wafer are aligned and tile high melting point lead tin solder are reflowed, forming the memory chip pairs. The memory chip pairs are separated by diamond saw dicing. The dicing saw track (45) will cut across the solder balls and leave the solder surfaces flush with the edge of the chip. A graphite boat or any material with good thermal conductivity, having many individual compartments is used to assemble the memory chip cube. The memory chip pairs are placed inside their compartment to insure precise spacings between the chips. This spacing is assured by dividing bars in the assembly boat (30) and by solder balls and maintained by the assembly silicon bar having one surface coated with LMA solder which is placed in contact with the chips when the bar is placed on top the memory chip pair. The surface with LMA solder touches the HMA solder ball on the top edges of the memory chip pairs. The boat along with the memory chip pairs is passed through a hot gas furnace. The maximum temperature of the furnace is higher than that of melting point of the LMA solder but is lower than that of the HMA solder. The LMA solder on the silicon bar will melt and join the silicon bar to the memory chip pairs to form a memory chip cube. The memory chip cube will be removed from the boat after it is cooled down to room temperature. The memory cube is placed on the packaging substrate. The memory chip cube is joined to the base member substrate through the HMA solder balls after it is reheated above the melting point of HMA solder. The silicon bar will be removed at the end of memory cube joining process or in a separated packaging substrate re-heating process after joining. The temperature of the packaging substrate for removing the silicon bar is preferred to be lower than the melting point of HMA solder and higher than that of LMA solder. FIG. 4 shows a view of the memory chip cube assembling boat. This boat is preferably used to assemble the memory chip cube. The material of the boat should be chosen to be graphite or any high thermal conductive material. There are many compartments in the boat and each compartment maintains a specific spacing between chip pairs by a divider portion of the boat shown as the ladder of the ladder assembly boat (30). The dimension of each compartment is so chosen that if the memory chip pairs are placed inside the compartment, then lead tin balls (43) of the chip pair (11) inside the assembled memory chip cube will be captured at the appropriate point by the lead tin pad on the packaging substrate, such as pad (21) or pad (18) or others as shown in FIG. 2. FIG. 5 shows a view of the boat for assembling the memory chip cube and the memory chip pairs which were placed inside the assembling boat. Thus, in accordance with the invention, a multitude of memory chip pairs (11) of chips (14) and (15) are placed and stand on their edges in the graphite assembling boat as shown in FIG. 5. The edges of the chip pairs with signal I/O lead tin balls (43) are on the bottom. The edges with spacing lead tin ball or balls (44) are on the top. A silicon assembly bar (41) is used as illustrated in FIGURE 6 with the assembling boat, to join memory chip pairs into a memory chip cube. This silicon supporting bar (41) is placed on top of the chip pairs (11) as shown in FIG. 6. One surface of the bar is coated with a layer of LMA (Low Melt Alloy) solder. When the bar is placed, the face of the bar with such solder is facing and touching the solder balls (44) on the chip pairs. Then the graphite boat, chip pairs and silicon bar are pushed through a hot gas furnace. As the assembly is passed through the hot gas furnace, the maximum temperature of the assembly is higher than the melting point LMA solder but lower than that of HMA (High Melt Alloy) solder. Therefore, during this period, the LMA solder will be liquified and the HMA solder maintained solid. Therefore LMA solder on the silicon bar will be melted and alloy the HMA solder on the chip pair's edge. As the assembly is cooled down below the melting point of LMA solder, joints will be formed between the silicon bar and all the silicon chip pairs (11). After the joining process, as the temperature of the solder is cooled below the melting point of the HMA solder but above the melting point of the LMA solder, the silicon support bar can be removed. Alternatively, it is removed by reheating. Our memory chip cube (42) comprises all the chip pairs in the assembly boat and silicon supporting bar.

Figure 7:
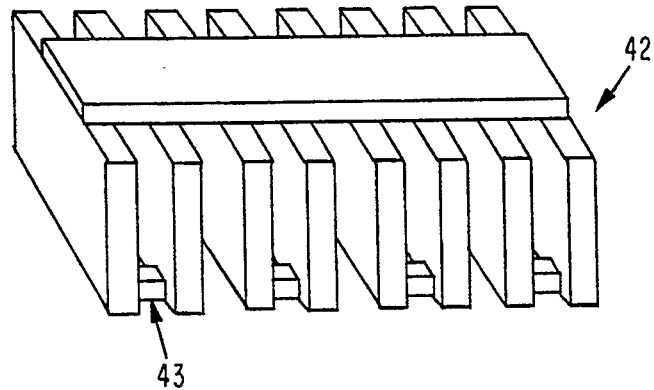
FIG. 7 shows a view of the memory chip cube after it was removed from the assembling boat.

FIG. 7 shows a view of the memory chip cube after it was removed from the assembling boat. Then the memory cubes (42) along with the connecting chips (19) are placed and joined to the packaging substrate (10) with the solder pads (21, 18, etc.). The silicon supporting bar (41) is removed by re-heating the assembly to a temperature higher than of the that of the melting point LMA solder and lower than that of HMA solder. The memory chip cube (42) then becomes the memory chip cube (40)

The solder pads such as (20) of the interconnecting chip and solder pads of (43) of the memory chip cube are aligned with their corresponding connecting pads (21) and (18) on the substrate (10). Electrical connection between the interconnect chip and the packaging substrate (10) and the memory chip pairs (11) and the silicon substrate (10) are made by lead tin ball joints on pads (21) and (18). Wiring (20) on the packaging substrate (10), shown in FIG. 2 will connect the interconnect chip (19) and tile vertically mounted memory pairs (11) of the memory chip cube via the interconnection lines on the base member substrate between the pads (21) and (18) of FIG. 2 to form the completed intermediate integrated chip package illustrated by FIG. 8 which shows a top view of vertical chip mount memory package. In our preferred embodiment it comprises four sets of eighty memory chips and their respective interconnect chips.

The base support member in accordance with our invention becomes a support for a protective cap and for cooling plates which are attached to the substrate. When the silicon substrate is used for the packaging substrate, the water-cooled cold plate or air-cooled cold plate is directly attached on the back side of the silicon substrate.

Figure 9:
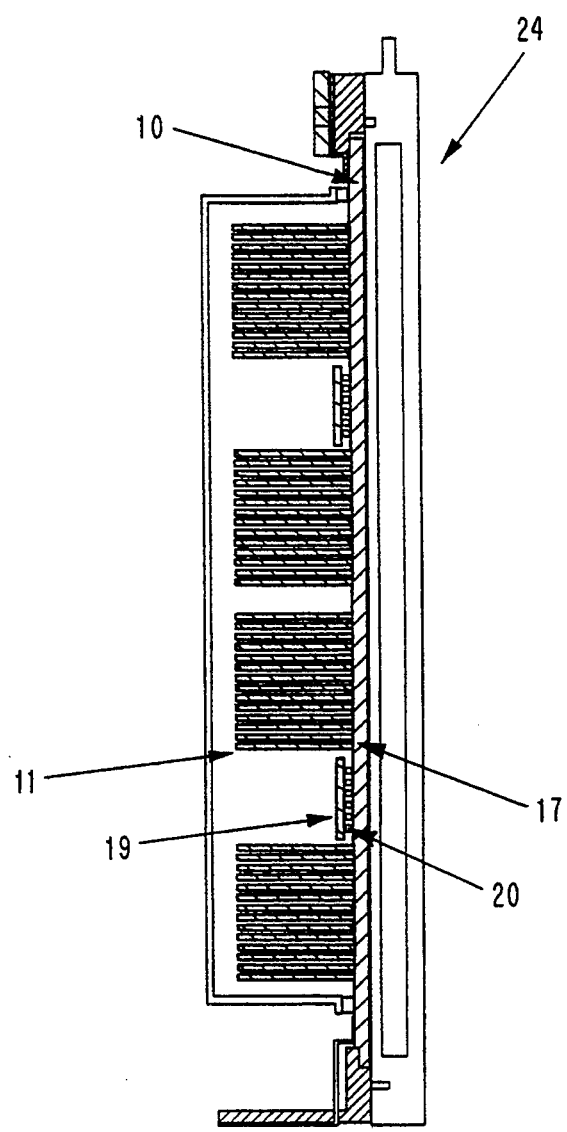
FIG. 9 illustrates the alternative embodiment of one vertical mount memory package with silicon substrate as the packaging substrate, using a liquid-cooled heat-dissipating structure.
Figure 10:
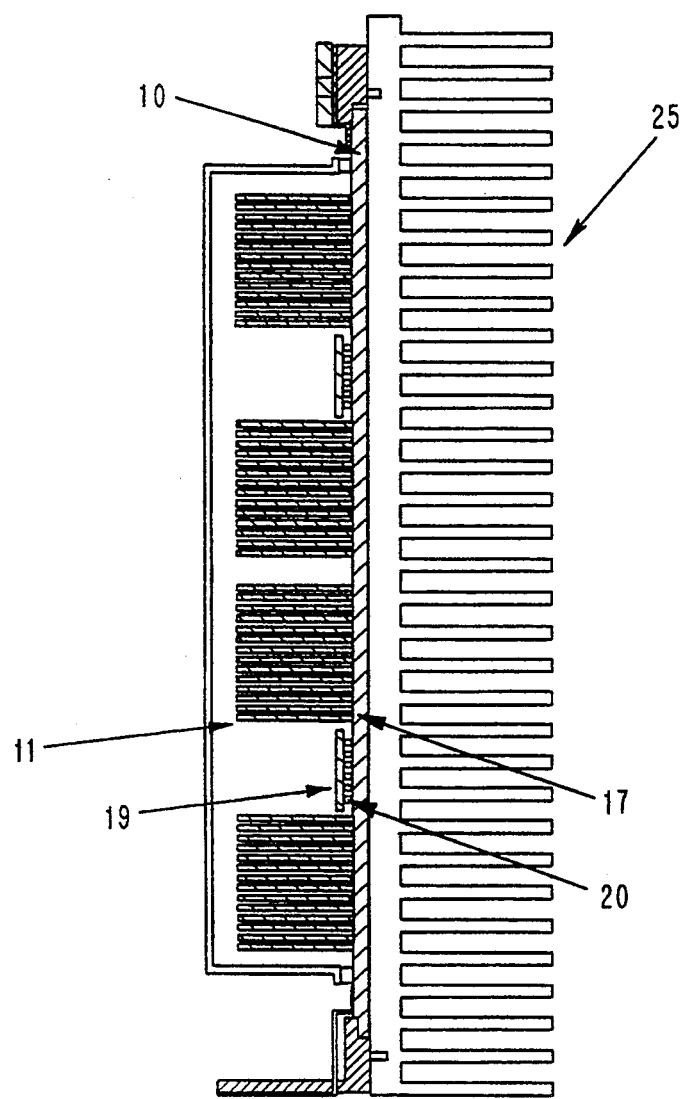
FIG. 10 illustrates an embodiment of a vertical chip memory package with silicon substrate as the packaging substrate and air-cooled heat-dissipating structure with cooling fins.

When the ceramic substrate or printing circuit card is used for the packaging substrate, the cooling scheme preferably uses fluorocarbon fluid internal cooling and a water-cooled cold plate or an air-cooled cold plate for external cooling. FIG. 9 illustrates an embodiment of a vertical chip memory package with silicon substrate as the packaging substrate and air-cooled heat-dissipating structure and the use of a cap enclosing the memory cubes and interconnection chips (19) mounted on the substrate (10). The chip area will be capped to protect the semiconductor chips (11) and (19) from corrosion. If a silicon substrate is chosen as the packaging substrate, a water-cooled cold plate (24), as shown in FIG. 9 or air-cooled cold plate (25) as shown in FIG. 10, will be attached to the back side of the silicon substrate (10).

FIG. 9 illustrates the alternative embodiment of one vertical mount memory packages with silicon substrate as the packaging substrate, using a liquid-cooled heat dissipating structure. The pad on pad connector technology is used to join the memory chip package I/O to the next level package. The power and the signal I/O will be fed through to the integrated circuit pinout with a flex I/O (23) from both ends of the substrate as shown in FIG. 8. The cold plate (25), shown in FIG. 10, is located on the back side the silicon substrate (10). The cooling paths for the semiconductor chips (11) and (19) start from silicon chip, lead tin pads (21) and (20), lead tin balls to silicon substrate (10) and then to cold plate (25). Such cooling path will provide sufficient cooling capability for the interconnect chips (19) and the memory chip pairs (11).

Figure 11:
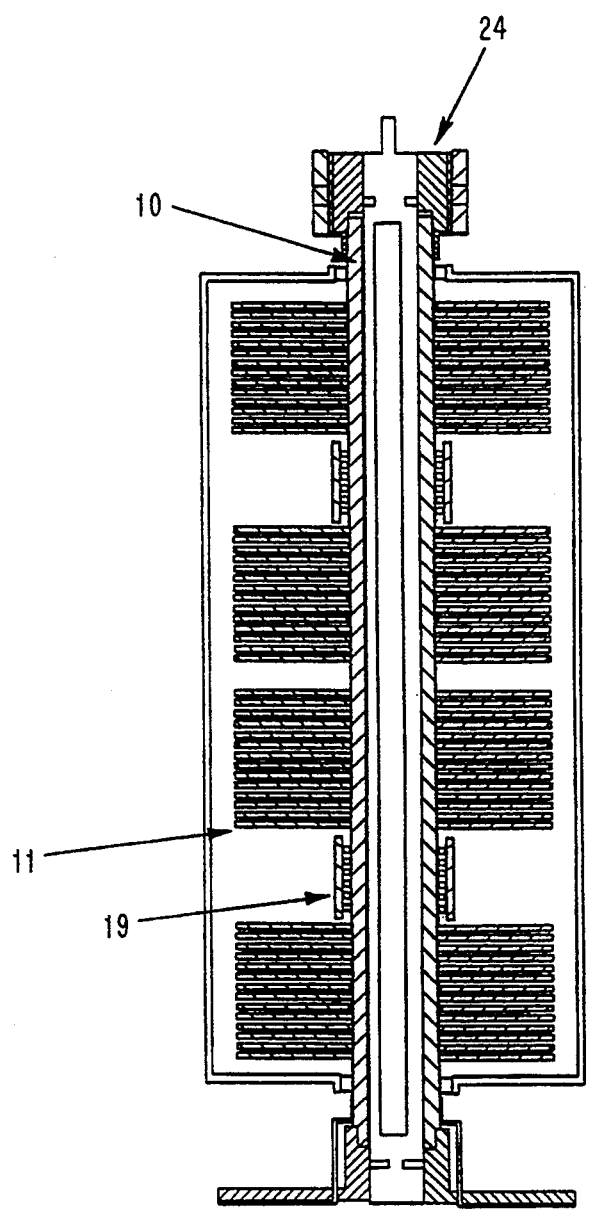
FIG. 11 illustrates the preferred embodiment of two vertical mount memory packages with silicon substrate as the packaging substrate, using a common liquid-cooled heat-dissipating structure.

FIG. 11 illustrates the preferred embodiment of two vertical mount memory packages with a silicon substrate as the packaging substrate, using a common liquid-cooled heat dissipating structure. To further improve the packaging density, two memory chip packages with a silicon substrate as the packaging substrate can share one cold plate (24) as shown in FIG. 11.

Figure 12:
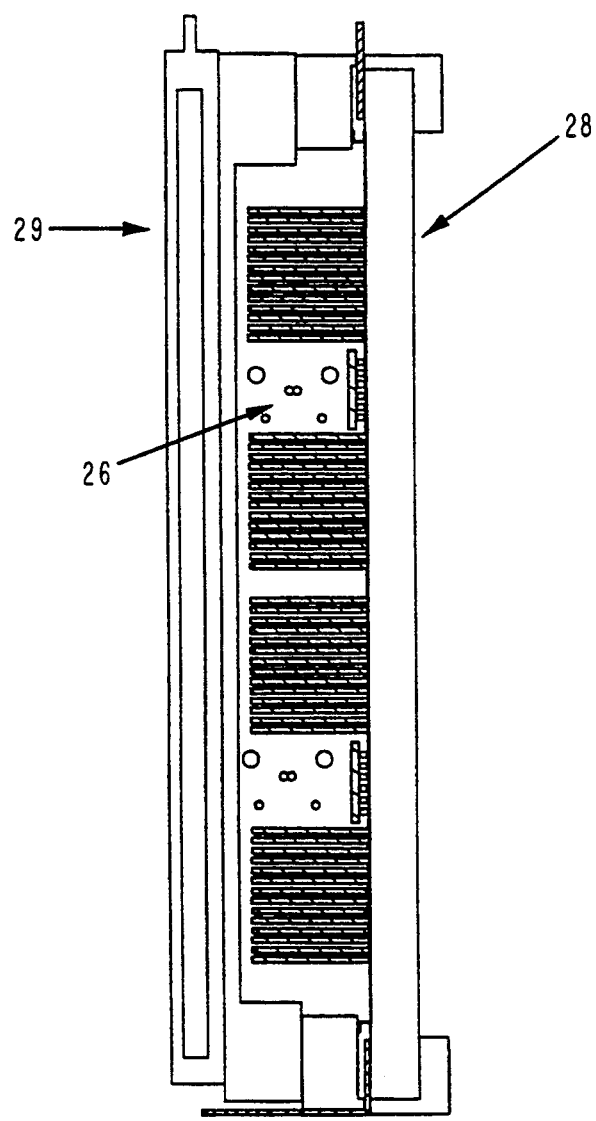
FIG. 12 illustrates an alternate embodiment of a vertical chip memory package with ceramic substrate as the packaging substrate, using internal fluorocarbon fluid cool and air or liquid external cool heat-dissipating structure.

FIG. 12 illustrates an alternate embodiment of a vertical chip memory package with a ceramic substrate as the packaging substrate, using an internal fluorocarbon fluid cool and air or liquid external cool heat dissipating structure. If ceramic substrate (28) is chosen as the packaging substrate, then fluorocarbon fluid (26) internal cooling and water cold plate (29) or air cold plate external cooling, such as that shown in FIG. 12 is preferred to be used.

While we have described our preferred embodiments of our invention, it will be understood that those skilled in the art, both now and in the future, may make various improvements and enhancements which fall within the scope of the claims which follow. These claims should be construed to maintain the proper protection for the invention first disclosed.

What is claimed is:

1. An integrated circuit chip package comprising:
   a packaging wiring base substrate having a planar surface and having a plurality of bonding interconnect pads located on said planar surface,
   at least one interconnection chip horizontally mounted on said planar surface and disposed horizontally and parallel to the planar surface with interconnection to first selected ones of said plurality of bonding interconnect pads,
   a plurality of integrated circuit memory chips arranged as memory chip pairs mounted on the planar surface of the base substrate and electrically connected and mechanically bonded to second selected ones of said plurality of bonding interconnect pads located on said planar surface, said memory chip pairs being placed vertically and normal to the planar surface of said base substrate in close spacing between one another to form a memory chip cube mounted on said second selected ones of said plurality of bonding interconnect pads located on said planar surface of the packaging wiring base substrate, a plurality of interconnections between said first and second selected ones of said plurality of interconnect pads located to interconnect said at least one interconnection chip and said memory chip pairs, and an enclosure for said at least one interconnection chip and said plurality of integrated circuit memory chips to cover the integrated circuit memory chips which are mounted on said base substrate.

2. The package of claim 1 wherein said at least one interconnection chip and the memory chip pairs of the memory chip cube are connected electrically to the packaging wiring base substrate with solder balls.

3. The package of claim 1 wherein said at least one interconnection chips and the memory chips are wired together and are wired to a next level package through wiring inside the packaging wiring base substrate and an input/output line of the integrated circuit chip package.

4. The package of claim 1 wherein a memory chip pair of said plurality of integrated circuit memory chips is formed by a pair of memory chips joined together with solder balls.

5. The package of claim 1 wherein a pair of memory chips form a memory chip pair joined together with two rows of solder balls on opposite edges of the memory chip pair, a first row of said solder balls being located on a bottom edge of a chip pair serving to connect the chip pair mechanically to each other and to connect signal and power I/O of the memory chips to power and I/O signal wiring of the packaging base substrate, and wherein a second row of said solder balls is positioned on a top edge of said chip pair for maintaining spacing of the chip pairs.

6. The package of claim 5 wherein, during assembly of each memory chip cube, the second row of said solder balls maintains the spacing of the chip pairs and connects a temporary silicon assembly bar to the chip pairs to maintain the spacing when the memory chip pairs are assembled into a memory chip cube.

7. The package of claim 5 wherein pads for solder connection to an edge of a chip pair are of even number in a row and the pads have mirror symmetry such that, when said memory chips are turned face to face to form said chip pairs, the pads for solder connection to the edge of a chip pair are aligned.

8. The package of claim 1 wherein a plurality of the memory chip pairs are joined together to form a memory cube and joined to the packaging wiring base substrate so that individual solder balls on the packaging wiring base substrate are connected to one signal or power I/O of either chip in the chip pair.

9. The package of claim 1 wherein the packaging wiring base substrate comprises a silicon substrate to which a cold plate is directly attached for cooling the back side of the silicon substrate.

* * * * *